United States Patent
Cheng et al.

(10) Patent No.: US 8,324,058 B2
(45) Date of Patent: Dec. 4, 2012

(54) CONTACTS FOR FET DEVICES

(75) Inventors: Kangguo Cheng, Guilderland, NY (US); Bruce B. Doris, Slingerlands, NY (US); Keith Kwong Hon Wong, Wappingers Falls, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 12/941,042

(22) Filed: Nov. 6, 2010

(65) Prior Publication Data

US 2012/0112279 A1    May 10, 2012

(51) Int. Cl.
*H01L 21/336* (2006.01)
*H01L 21/76* (2006.01)
*H01L 21/4763* (2006.01)
*H01L 21/44* (2006.01)

(52) U.S. Cl. ........ 438/294; 438/404; 438/443; 438/637; 438/642; 438/655; 438/666; 257/E21.593; 257/E21.619

(58) Field of Classification Search .................. 438/294, 438/404, 443, 637, 640, 642, 655, 666; 257/E21.593, E21.619
See application file for complete search history.

(56) References Cited

U.S. PATENT DOCUMENTS

| | | | | |
|---|---|---|---|---|
| 6,133,105 A * | 10/2000 | Chen et al. | ..................... | 438/296 |
| 6,274,913 B1 * | 8/2001 | Brigham et al. | ............... | 257/368 |
| 6,335,249 B1 * | 1/2002 | Thei et al. | ..................... | 438/296 |
| 6,780,762 B2 | 8/2004 | Ireland | .......................... | 438/640 |
| 2001/0036693 A1 * | 11/2001 | Brigham et al. | ............... | 438/183 |
| 2002/0137295 A1 * | 9/2002 | Thei et al. | ..................... | 438/296 |
| 2003/0022426 A1 * | 1/2003 | Kumamoto | ................... | 438/197 |
| 2006/0071268 A1 | 4/2006 | Tai | ................................ | 257/330 |
| 2007/0267753 A1 * | 11/2007 | Luo et al. | ...................... | 257/773 |
| 2007/0298575 A1 | 12/2007 | Nouri | ............................ | 438/388 |
| 2008/0006855 A1 * | 1/2008 | Mandelman et al. | ......... | 257/288 |

* cited by examiner

*Primary Examiner* — Kevin Parendo
(74) *Attorney, Agent, or Firm* — George Sai-Halasz; Louis J. Percello

(57) ABSTRACT

A method for contacting an FET device is disclosed. The method includes vertically recessing the device isolation, which exposes a sidewall surface on both the source and the drain. Next, silicidation is performed, resulting in a silicide layer covering both the top surface and the sidewall surface of the source and the drain. Next, metallic contacts are applied in such manner that they engage the silicide layer on both its top and on its sidewall surface. A device characterized as being an FET device structure with enlarged contact areas is also disclosed. The device has a vertically recessed isolation, thereby having an exposed sidewall surface on both the source and the drain. A silicide layer is covering both the top surface and the sidewall surface of both the source and the drain. Metallic contacts to the device engage the silicide on its top surface and on its sidewall surface.

17 Claims, 6 Drawing Sheets

CONTACTS FOR FET DEVICES

BACKGROUND

The present invention relates to electronic devices. In particular, it relates to FET (Field-Effect-Transistor) devices and their electrical contacts.

Today's integrated circuits include a vast number of devices. As FET devices are being scaled down, the technology becomes more complex, and changes in device structures and new fabrication methods are needed to maintain the expected performance enhancement. In deeply scaled FET devices the area for making electrical contacts is decreasing to the point that parasitic contact resistance may become a device performance problem.

BRIEF SUMMARY

A method for contacting an FET device is disclosed. The method includes receiving the FET device having a completed isolation and a source and drain, and then vertically recessing the isolation. In this manner one exposes a sidewall surface on both the source and on the drain. Next, silicidation is performed, after which a silicide layer covers both the top surface and the sidewall surface of both the source and of the drain. Next, metallic contacts are applied in such manner that they engage the silicide layer on both its top and on its sidewall surface. A device characterized as being an FET device structure with contacts is also disclosed. The device has a vertically recessed isolation, thereby having an exposed sidewall surface on both the source and the drain. A silicide layer is covering both the top surface and the sidewall surface of both the source and the drain. Metallic contacts to the device engage the silicide on its top surface and on its sidewall surface.

BRIEF DESCRIPTION OF THE SEVERAL VIEWS OF THE DRAWINGS

These and other features of the present invention will become apparent from the accompanying detailed description and drawings, wherein.

DETAILED DESCRIPTION

Figure 1:
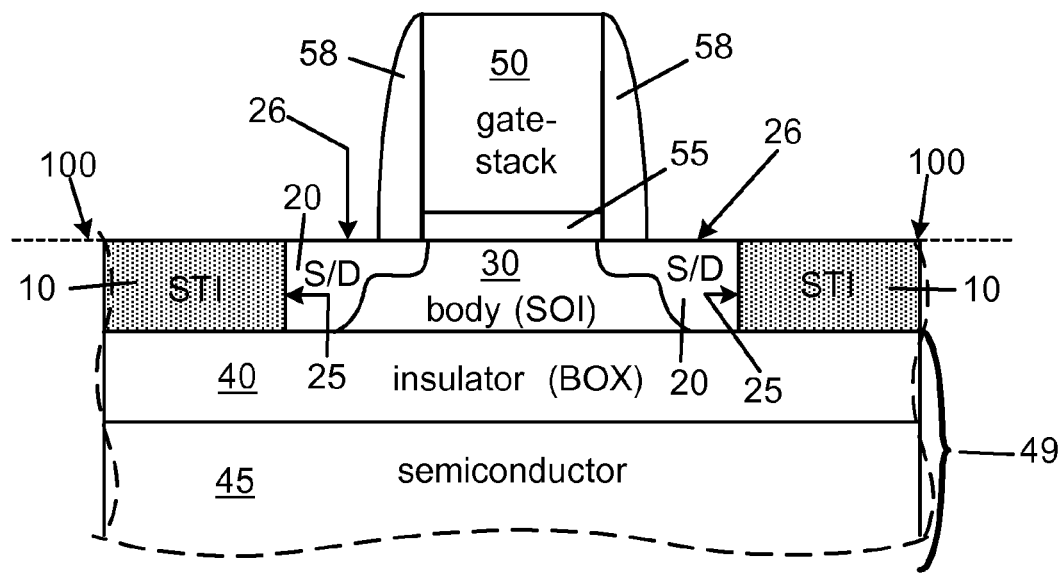
FIG. 1 shows a schematic cross section of an FET device at a fabrication stage when it is received, and ready for applying embodiments of the invention.

It is understood that Field Effect Transistor-s (FET) are well known in the electronic arts. Standard components of an FET are the source, the drain, the body in-between the source and the drain, and the gate, or gate-stack. The gate-stack is overlaying the body and is capable to induce a conducting channel in the body between the source and the drain. In the usual nomenclature, the channel is hosted by the body. In advanced, deeply submicron, devices the source and drain are often augmented by extensions. These extensions are shallower than the source and drain, and typically contact the channel at the gate edge. The gate is typically separated from the body by the gate insulator. Depending whether the "on state" current in the channel is carried by electrons or holes, the FET comes as NFET or PFET. (In different nomenclature the NFET and PFET devices are often referred to as NMOS and PMOS devices.) It is also understood that frequently the NFET and PFET devices are used together in circuits. Such NFET, PFET combination circuits may find application in analogue circuits, or in digital circuits where they are typically coupled into CMOS configurations. In circuit applications individual devices are usually separated from one another both physically and electrically by isolation. Such isolations are well known in the art, a typical one being, for instance, a shallow trench isolation (STI). Often the isolation is regarded as part of the FET device.

The most common material of microelectronics is silicon (Si), or more broadly, Si based materials. Si based materials are various alloys of Si in the same basic technological content as Si. Such Si based materials of significance for microelectronics are, for instance, the alloys of Si with other elements of the IV-th group of the periodic table, Group IV elements for brevity. Such alloys formed with Ge and C are silicon germanium (SiGe), and silicon carbon (SiC). Essentially pure Ge itself may also play a role in Si based microelectronics. The devices in the embodiments of the present disclosure are typically of Si, and/or of Si alloyed with Ge or C. However, other materials are not excluded, for instance the III-V or II-IV semiconductors. The semiconducting materials of the device bodies in representative embodiments of the invention are in a single-crystalline state.

It is known in the art that there are FET devices characterized as being silicon-on-insulator (SOI) FETs. Such devices are formed in a layer of single crystal semiconductor material on top of an insulating layer. Typically, the semiconductor material is a Si based single crystal material, often essentially pure Si. The insulating layer is typically a so called buried oxide (BOX) layer, which BOX layer, in turn, is over a silicon wafer piece. Generally in the art, the structure of the insulating layer and the Si wafer piece is being referred to as the substrate.

Microelectronics progress has been essentially synonymous with decreasing feature sizes. Decreased feature sizes allow for ever higher circuit counts, and increased circuit densities for integrated circuits (IC). However, along with the advantages of miniaturization there are also problems arising due to the smaller dimensions. A notable such problem is parasitic device resistance. In an ideal turned on FET device the effective resistance is due exclusively to the resistance of the channel. However, with decreasing feature size the channel resistance is decreasing, while contributions to the total device resistance from sources that for large devices were negligible are becoming prominent. One such unwanted resistance is the contact resistance. It is a resistance broadly defined as one that arises in-between the metal wires that contact the source and drain, and the edge of the device channel. In general, the smaller the contacted area on the source and drain the higher is the contact resistance. For instance, in the soon to be realized 22 nm gate length technology, the available contact hole areas may be as small as having 30 nm diameters. With further feature shrinkage in the future this problem will only become worse. There is need for solutions that increase contact areas to the source and the drain, while these solutions should not impact overall circuit density.

Embodiments of the present invention offer such solutions; they teach of enlarging the contacted area by including not only the usual top surfaces of the source and drain, but also their vertical sidewall surfaces. With enlarged contacted area the contact resistance decreases.

FIG. 1 shows schematic cross section of an FET device at a fabrication stage when it is received, and ready for applying embodiments of the invention. The term "received" is intended to be inclusive of any possible manner by which one may arrive at this initial stage of an embodiment of the invention. The fabrication of the FET device may have just reached this stage, or the FET at such stage of processing may have been supplied for the purpose to apply the fabrication steps involved in the embodiments of the present invention.

It is understood that processing of NFET and PFET devices is very well established in the art. It is further understood that there are large number of steps involved in such processing, and each step may have practically endless variations, known to those skilled in the art. For embodiment of this disclosure it is understood that the whole range of known processing techniques are available for fabricating the devices, but usually only those process steps will be detailed that are related to the embodiments of the present invention.

The device shown in FIG. 1 is fairly standard, and it may have features familiar in the art. FIG. 1 depicts an SOI device structure, but embodiments of the invention are not limited to SOI devices. Bulk devices, where the device body does not lay over an insulator, but it is part of a semiconductor substrate, are also included.

The FET device is supported by a substrate 49. The figure shows two layers of a substrate 49: an insulator 40, and a support structure 45, which support structure may be a semiconductor. The insulator 40, which typically is a buried oxide layer (BOX), is covering the support structure 45. The semiconductor of the support structure 45 is typically a piece of a silicon wafer. Without limitation, the substrate 49 may have more, or less, than the shown two layers. Or, as mentioned earlier, the FET device is not limited to SOI devices, in which case there would be no insulator layer 40.

A body 30 overlays the insulator 40. The thickness of the body 30 layer in case of an SOI device, may be between 3 nm to about 150 nm, with 5 nm to 100 nm being typical. A gate-stack 50 overlays the body 30 and it is capable to induce a conductive channel in the body between the source and drain 20. The gate stack 50 may have a length between 5 nm to 100 nm, with 15 nm to 30 nm being typical. A common indicator number, 20, is used for both the source and the drain, since embodiments of the disclosure, in general, may not distinguish between the two. The curve of the line depicting a boundary of the source and drain 20 is suggestive of so called source/drain extensions, but this should not be interpreted in limiting fashion. Any kind of source 20 and drain 20, fabricated by any means is included in embodiments of the instant invention.

Typically the gate-stack 50 is separated from the body 30 by the gate dielectric 55. Additional feature of the device, known in the art, is the optional sidewall 58. The FET device body 30, including the source and drain 20, are surrounded by an isolation 10 structure. A typical isolation in the art is a shallow trench isolation (STI), which is the one depicted 10 in the figure. However, one may envision other type of isolations known in the art, such as but not limited to, so called LOCOS isolation. For an advanced SOI device the STI 10 typically penetrates all the way down to the insulating layer 40, as shown in the figure. The device body 30 has an upper surface, which defines a principal surface 100, indicated with a dashed line, for the whole of the FET device. Usually an upper surface of an isolation 10 is approximately in level with the upper surface of the body 30, hence it is also essentially in level with the principal surface 100 of the device. As it is clear even from the schematic drawing of FIG. 1, that for the device in its present state only an upper surface 26 of the source and drain 20 is available for making a contact with the FET. Side surfaces 25 of the source and drain 20 are in contact with the isolation 10, hence not available for forming electrical contacts.

The device being processed typically is part of a larger IC on a chip. This is depicted on various figures by the wavy dashed line boundaries, indicating that the drawing typically may only be a small fraction of an integrated circuit.

Figure 2A:
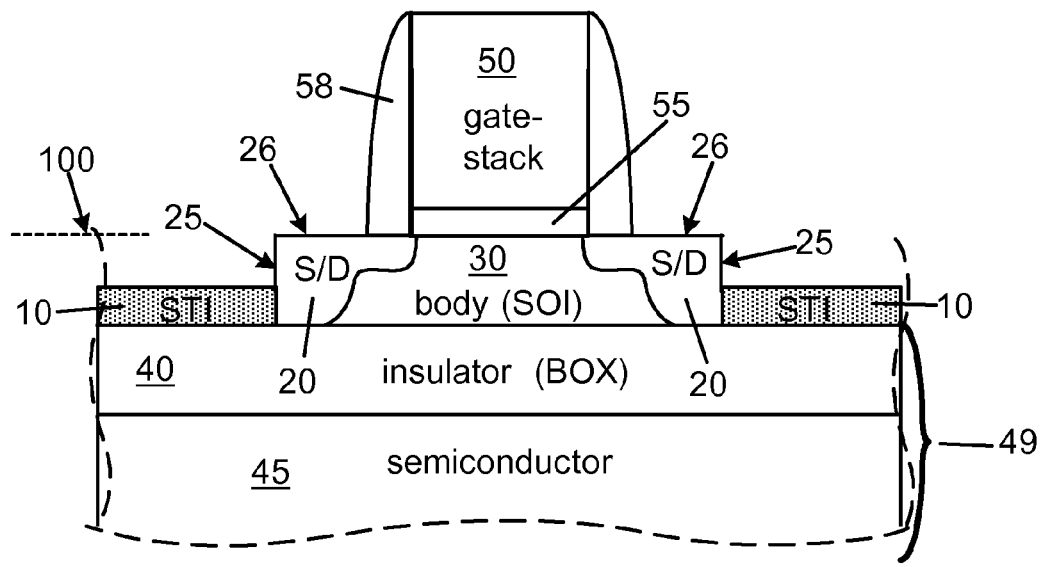
FIGS. 2A and 2B show in schematic cross section variations on recessing the isolation.
Figure 2B:
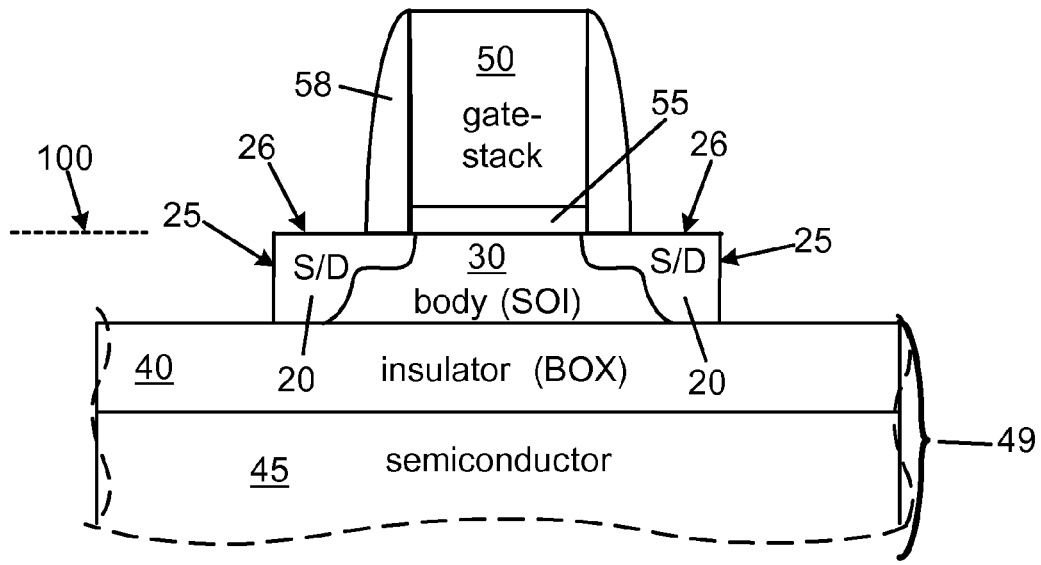

FIGS. 2A and 2B show in a schematic cross section variations on recessing the isolation. One may use a selective etch on the structure, as shown in FIG. 1, which selective etch would remove the isolation 10 commencing at the isolation's top surface. The material of the isolation typically is an oxide, most commonly silicon oxide, and a variety of etching techniques exist to selectively remove this oxide. For example, an aqueous solution containing hydrofluoric (HF) acid can be used to recess the oxide STI. Alternatively, a dry etch such as chemical oxide removal (COR), plasma etch, or reactive ion etch (RIE) may be used. The material of the isolation 10 may be of other dielectrics besides oxide, and selective removals for essentially all dielectrics are known. Selective removal is preferable because it saves on expensive masking steps, which would be needed if selective removal would not be available. Again, using SOI structures for illustration, FIG. 2A shows the isolation 10, which may be an STI, recessed vertically relative to the principal surface 100 using a selective etch. The etching is stopped when the isolation 10 is sufficiently recessed in a vertically offset position relative to the principal surface 100. FIG. 2B shows the case when sufficient recessing is such that the isolation 10 is completely removed down to the insulator (BOX) layer 40. If the isolation 10 and the insulator 40 are of same, or similar, materials, and selectivity is not adequate in stopping the etch upon removal of the isolation, one may use a timed etch.

The isolation 10 may have parts 11 (indicated in FIG. 6) that are underneath some device elements, such as for instance the gate-stack 50, which then are protected from removal. Accordingly, the etching may not recess the isolation 10 over its whole top surface, but at least over a portion 12 (indicated in FIG. 6) of the isolation area, the isolation is removed as indicated in FIGS. 2A and 2B.

When the isolation 10 is recessed relative to the principal surface 100, at least one sidewall surface 25 on both the source 20 and on the drain 20 becomes exposed. In the case when the isolation 10 is a STI, such a sidewall surface 25 is substantially perpendicular to the principal surface 100.

Figure 3:
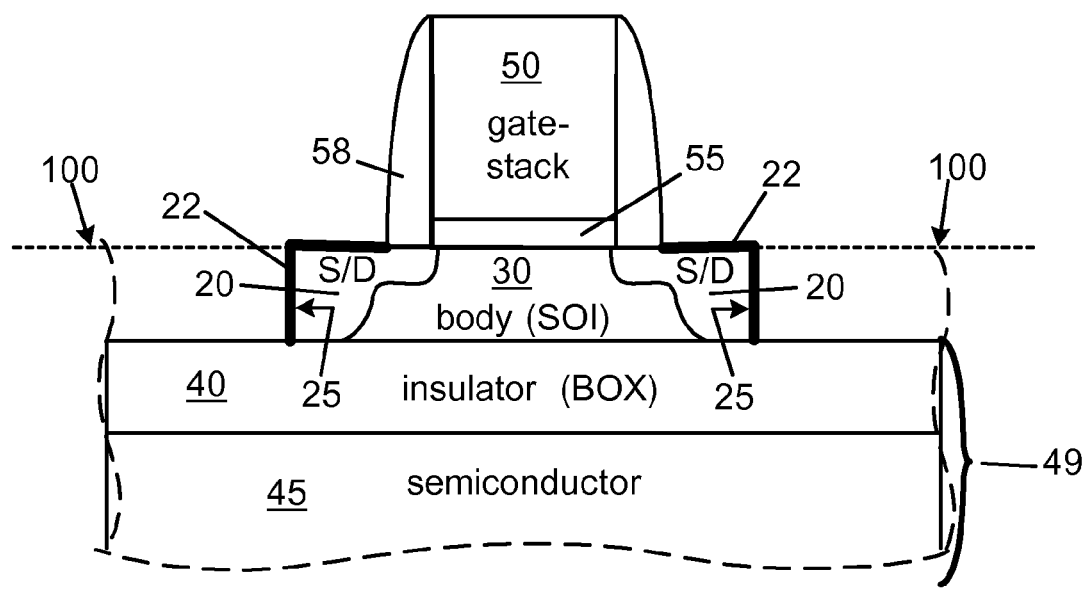
FIG. 3 shows in schematic cross section silicidation of multiple surfaces of the source and drain.

FIG. 3 shows in a schematic cross section silicidation of multiple surfaces of the source and the drain. After the recessing of the isolation, a silicidation step is performed by methods known in art. In typical silicidation all exposed semiconductor surfaces are converted into silicide, including the sidewall surface 25. After the silicidation, a silicide layer 22 covers the top surface 26 and the sidewall surface 25 of both the source 20 and of the drain 20. The silicide material may be any of the known ones in the art, such as but not limited to, nickel, cobalt, platinum, and other metal silicide. It should be noted that the area of the silicide 22, is larger than the top surface area 26 of the source and drain, due to the silicide 22 covering the sidewall surface 25, as well.

Figure 4:
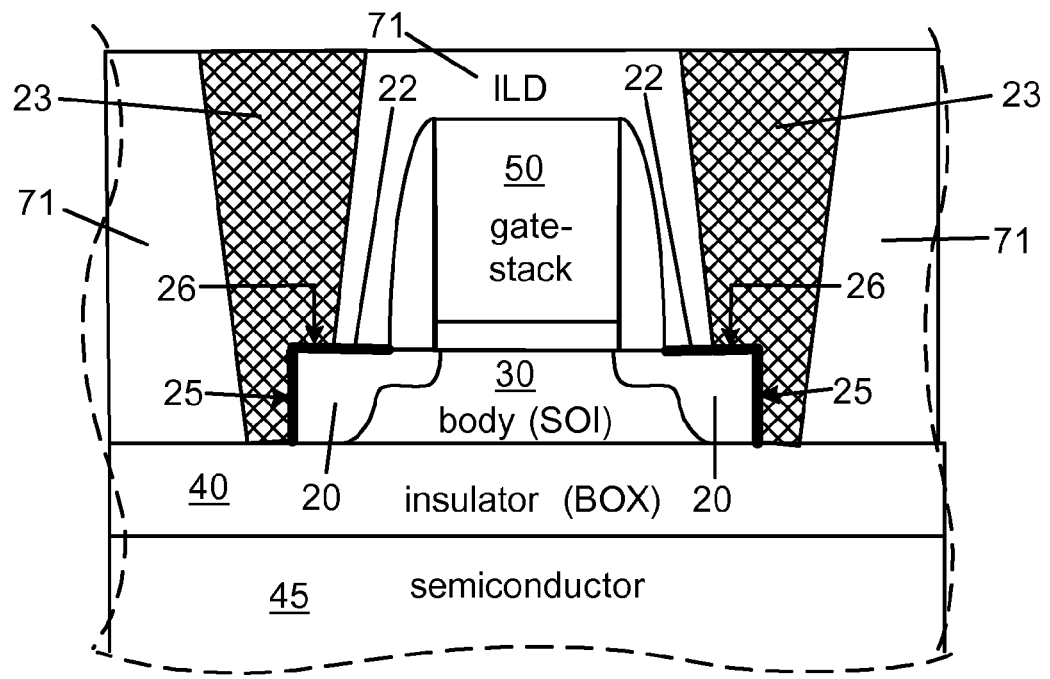
FIG. 4 shows in schematic cross section metallic contacts engaging the silicide layer on multiple surfaces.

FIG. 4 shows in a schematic cross section metallic contacts engaging the silicide layer on multiple surfaces. Following the silicidation, metallic contacts 23 are applied to the source and to the drain 20 in such manner that the metallic contacts 23 engage the silicide layer on the top surface 26 on both the source 20 and on the drain 20, and on the sidewall surface 25 on at least one of the source 20 and the drain 20. Typically the metallic contact 23 engages the sidewall surface 25 on both the source 20 and on the drain 20, as shown in the figure, but there may be applications where the sidewall surface 25 is engaged on one of the source, or drain, for instance, on the source 20 only. Such asymmetric cases are included in the embodiments of the invention. As it is clear, with contacting the sidewall 25 as well as the top surface 26, one is increasing the contact area, and consequently decreases the contact resistance, which is a preference for the embodiments of the invention. FIG. 4 also shows that in a representative embodiment, as known in the art, the device after silicidation is covered by a dielectric 71, a so called interlayer dielectric (ILD), and the metallic contacts 23 are filled vias opened up in the ILD 71. The material of the metallic contact 23 may be any one known in the art, for instance, but not limited to tungsten, copper, and other metals. A conductive liner such as ruthenium may be formed on the sidewalls and bottom of vias before filling the vias.

Figure 5A:
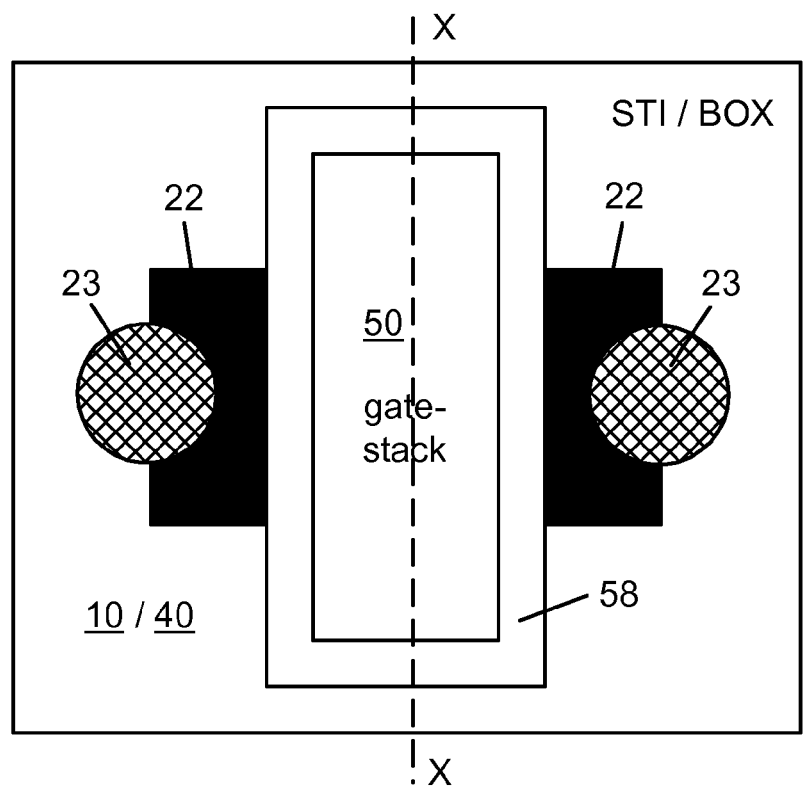
FIG. 5A-5C show in schematic top view variations in contacting surfaces of the silicided source and drain.
Figure 5B:
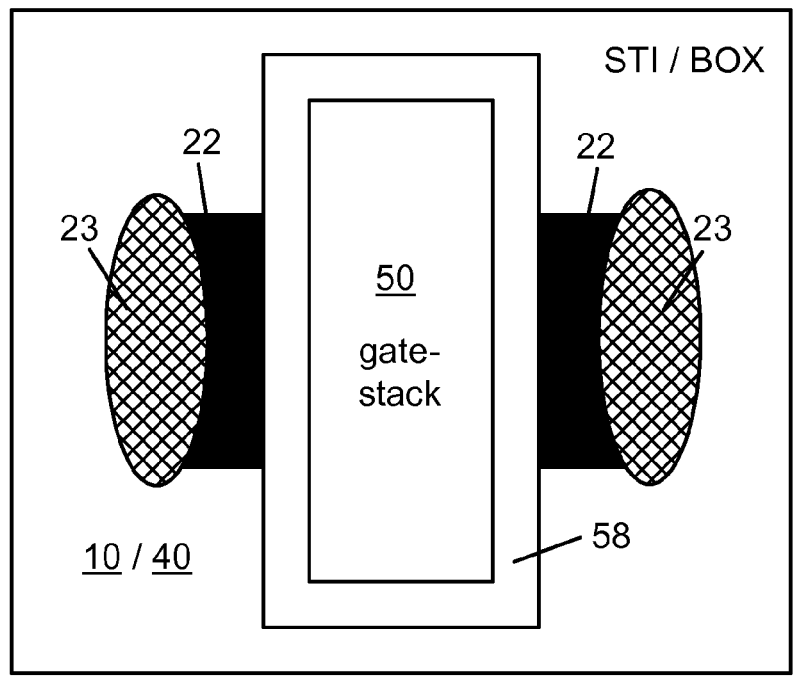
Figure 5C:
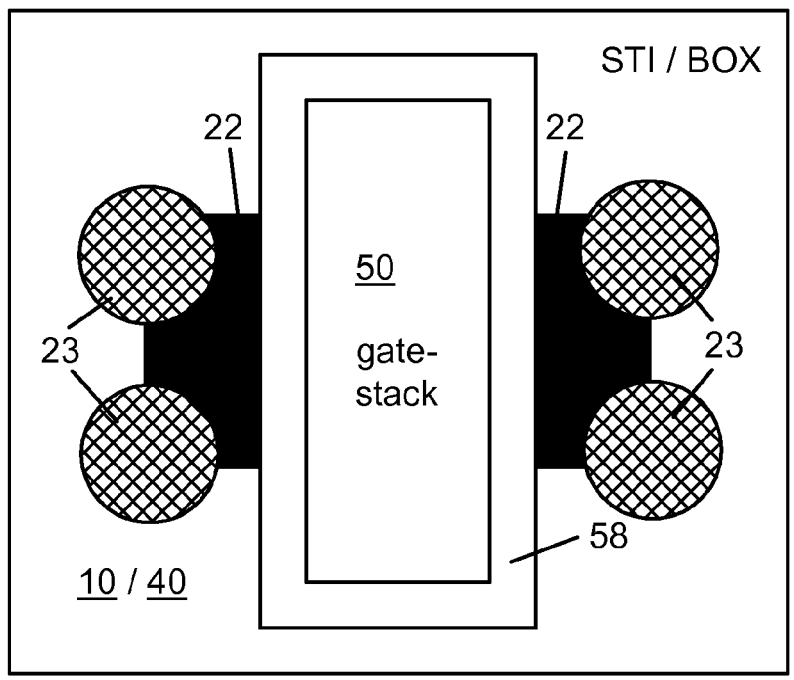

FIG. 5A-5C show in a schematic top view variations in contacting surfaces of the silicided source and drain. The top view displayed in these figures is symbolic, assuming that the ILD 71 is not present, and for the metallic contact 23, which often is a tapered via, only the contacting cross section is shown. The shown surface outside the device area may be isolation 10, such as STI, if the STI was not fully removed, or it may be the insulator layer 40, such as the BOX, in case of an SOI device and fully removed isolation.

FIG. 5A shows a typical case when an essentially circular metallic contact 23 engages the center of the silicide 22, which contact is large enough to overhang the top surface 26 and engage the silicide side surface 25, as well. Such may be the situation when the FET device is a relatively narrow device. The diameter of such a contact may be between 5 nm and 100 nm, with a more typical range of between 10 nm to 40 nm. The dashed X-X line indicates a cut, which is displayed in cross section in FIG. 6.

FIG. 5B shows an embodiment where the metallic contacts 23 are of an elongated form and are positioned to run along at least a portion of the width of the source 20 and the drain 20. Such may be the configuration for wider devices, where the device, and hence, the source 20 and drain 20 width may be many times, even hundreds of times that of the gate-stack length. The customary nomenclature is being followed, with the device length direction being the one parallel to the current flow in the device, in which case the gate length is approximately the distance between the source 20 and the drain 20.

FIG. 5C shows an embodiment where the metallic contacts 23 are engaging the silicide layer 22 at the corners of the source 20 and the drain 20. Such embodiments may further increase the contact area by engaging multiple sidewall 25 surfaces.

Figure 6:
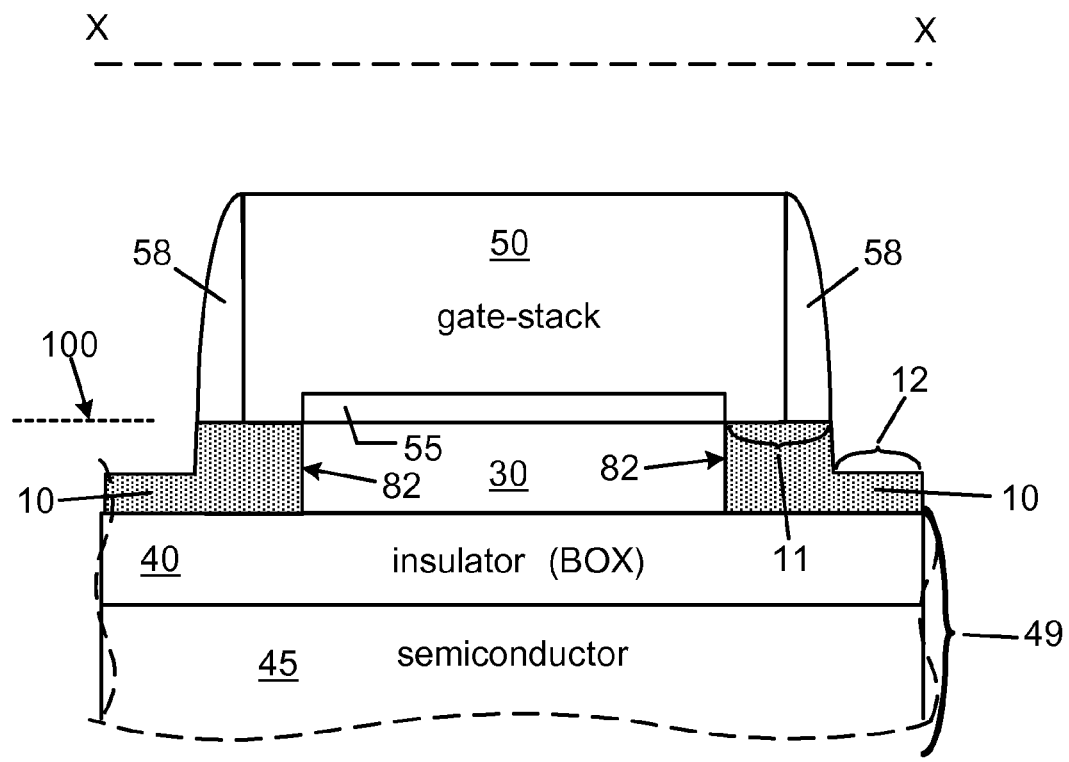
FIG. 6 shows in schematic cross section a cut of the FET device in the width direction.

FIG. 6 shows in a schematic cross section a cut of the FET device in the width direction, along the X-X line indicated in FIG. 5A. The channel current would flow in the plane perpendicular to the plane of the figure. This figure shows what was already indicated earlier in discussion with reference to FIG. 2, namely that the gate-stack 50 may have a portion overlaying the isolation 10, which occurs primarily in the width direction of the device. The overlaying portion of the gate-stack 50 protects the isolation 10 during the recessing etch of the isolation. Accordingly, as shown in FIG. 6, a part 11 of the isolation 10 which is underneath the gate-stack 50 remains essentially even with the principal surface 100. That portion 12 of the isolation 10, which is outside the protection of the gate-stack 50 is recessed. FIG. 6 shows a case when the vertically recessed portion 12 of the isolation 10 does not reach all the way down to the insulator 40. Leaving part 11 of the isolation 10 underneath the gate-stack 50 intact, may be useful because the body width-side-surface 82 is a potential location for so called parasitic corner devices, as they are known in the art. If the isolation 10 would not have been protected by the gate-stack, and left intact at the width-side-surface 82, which may also be called a corner surface 82, parasitic devices with different thresholds than the principal device could form there, and may cause operational problems.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under", "underneath", "top", "upper", "side", "on" "over", etc., as used herein refer to relative location and orientation of various portions of the structures with respect to one another, and are not intended to suggest that any particular absolute orientation with respect to external objects is necessary or required.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art. The scope of the invention is defined by the appended claims.

The invention claimed is:

1. A method for contacting an FET device, comprising:
   receiving said FET device with a source and a drain consisting of a semiconductor material and with an isolation surrounding said FET device, furthermore said FET device comprises a body having an upper surface, wherein said upper surface of said body defines a principal surface for said FET device;
   recessing vertically said isolation relative to said principal surface using a selective etch exposing a sidewall surface on both said source and said drain;
   performing silicidation, after which silicide is covering top surfaces on both said source and said drain and said sidewall surface of both said source and said drain, wherein said top surfaces are substantially parallel with said principal surface;
   applying metallic contacts to said source and to said drain in such manner that said metallic contacts engage said silicide on said top surfaces and on said sidewall surface of at least one of said source and of said drain; and
   wherein said FET device further comprises a gate-stack having a portion overlaying said isolation, wherein said portion of said gate-stack protects said isolation during said recessing, and wherein a part of said isolation underneath said gate-stack is essentially even with said principal surface.

2. The method of claim 1, wherein said method further comprises:
applying said metallic contacts to said source and to said drain in such manner that said metallic contacts engage said silicide on said sidewall surface of both of said source and of said drain.

3. The method of claim 1, wherein said FET device is a semiconductor on insulator (SOI) FET device.

4. The method of claim 3, wherein said method further comprises:
fully removing said isolation down to an insulator, wherein said insulator is a buried insulator of a SOI substrate for said SOI FET device.

5. The method of claim 1, wherein said isolation is a shallow trench isolation (STI).

6. The method of claim 5, wherein said sidewall surface on both said source and said drain is substantially perpendicular to said principal surface.

7. The method of claim 5, wherein said STI consists essentially of silicon oxide.

8. The method of claim 1, wherein said source and said drain both have a width, and wherein said method further comprises:
shaping said metallic contacts into an elongated form, wherein said elongated form is positioned along at least a portion of said width of said source and said drain.

9. The method of claim 1, wherein said source and said drain both have corners, and wherein said method further comprises:
using said metallic contacts to engage said silicide layer on said corners of said source and said drain.

10. A method for contacting an FET device, comprising:
receiving said FET device with a source and a drain consisting of a semiconductor material and with an isolation surrounding said FET device, furthermore said FET device comprises a body having an upper surface, wherein said upper surface of said body defines a principal surface for said FET device;
recessing vertically said isolation relative to said principal surface using a selective etch exposing a sidewall surface on both said source and said drain;
performing silicidation, after which silicide is covering top surfaces on both said source and said drain and said sidewall surface of both said source and said drain, wherein said top surfaces are substantially parallel with said principal surface;
applying metallic contacts to said source and to said drain in such manner that said metallic contacts engage said silicide on said top surfaces and on said sidewall surface of at least one of said source and of said drain; and
wherein said FET device is a semiconductor on insulator (SOI) FET device, wherein said recessing includes fully removing said isolation down to an insulator, wherein said insulator is a buried insulator of a SOI substrate for said SOI FET device.

11. The method of claim 10, wherein said method further comprises:
applying said metallic contacts to said source and to said drain in such manner that said metallic contacts engage said silicide on said sidewall surface of both of said source and of said drain.

12. The method of claim 10, wherein said FET device further comprises a gate-stack having a portion overlaying said isolation, wherein said portion of said gate-stack protects said isolation during said recessing, and wherein a part of said isolation underneath said gate-stack is essentially even with said principal surface.

13. The method of claim 10, wherein said isolation is a shallow trench isolation (STI).

14. The method of claim 13, wherein said sidewall surface on both said source and said drain is substantially perpendicular to said principal surface.

15. The method of claim 13, wherein said STI consists essentially of silicon oxide.

16. The method of claim 10, wherein said source and said drain both have a width, and wherein said method further comprises:
shaping said metallic contacts into an elongated form, wherein said elongated form is positioned along at least a portion of said width of said source and said drain.

17. The method of claim 10, wherein said source and said drain both have corners, and wherein said method further comprises:
using said metallic contacts to engage said silicide layer on said corners of said source and said drain.

* * * * *